United States Patent
Noma et al.

(10) Patent No.: US 6,437,424 B1
(45) Date of Patent: Aug. 20, 2002

(54) NON-VOLATILE SEMICONDUCTOR MEMORY DEVICE WITH BARRIER AND INSULATING FILMS

(75) Inventors: Takashi Noma; Masaji Hara; Kimihide Saito; Ryo Kawai; Yoichi Kanuma; Kazuo Okada, all of Gunma (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 09/505,980

(22) Filed: Feb. 16, 2000

(30) Foreign Application Priority Data

Mar. 9, 1999 (JP) .......................... 11-061417
Jul. 13, 1999 (JP) .......................... 11-199506

(51) Int. Cl.[7] .......................... H01L 29/788
(52) U.S. Cl. .................. 257/639; 257/315; 257/382
(58) Field of Search ................ 257/314–326, 257/382–385; 438/257–267, 618–651

(56) References Cited

U.S. PATENT DOCUMENTS

| | | | | |
|---|---|---|---|---|
| 3,500,142 A | * | 3/1970 | Kahng | 365/185.01 |
| 4,399,523 A | * | 8/1983 | Gerber | 365/185.18 |
| 4,830,974 A | * | 5/1989 | Chang et al. | 438/201 |
| 5,168,343 A | * | 12/1992 | Sakamoto | 257/513 |
| 5,310,626 A | * | 5/1994 | Fernandes et al. | 430/327 |
| 5,702,981 A | * | 12/1997 | Maniar et al. | 438/627 |
| 5,766,991 A | * | 6/1998 | Chen | 438/231 |
| 5,989,957 A | * | 11/1999 | Ngo et al. | 438/257 |
| 6,127,258 A | * | 10/2000 | Watanabe et al. | 438/625 |

FOREIGN PATENT DOCUMENTS

JP      6-216122     * 8/1994

* cited by examiner

Primary Examiner—Howard Weiss
Assistant Examiner—Marcos D. Pizarro-Crespo
(74) Attorney, Agent, or Firm—Fish & Richardson P.C.

(57) ABSTRACT

A barrier film of a SiON film is formed below an interlayer insulating film which is a single layer film or laminated film of an TEOS film or SOG film covering a floating gate 4 and control gate 6. The SiON film which is good in moisture blocking but poor in coverage is covered with another TEOS film which is better in coverage than the SiON film, thereby improving the barrier property of the barrier film. Such a configuration prevents moisture or H atoms contained in the TEOS film or SOG film from being diffused and trapped by the tunneling oxide film 3, thereby improving the trap-up rate and hence endurance characteristic and extending the operation life of a memory cell.

9 Claims, 10 Drawing Sheets

NON-VOLATILE SEMICONDUCTOR MEMORY DEVICE WITH BARRIER AND INSULATING FILMS

BACKGROUND OF THE INVENTION

1. Field of the Invention

The present invention relates to a non-volatile semiconductor memory device and a method for manufacturing it, particularly to a non-volatile semiconductor memory device having a floating gate and a control gate which is formed to overlap the floating gate through a tunneling oxide film covering the floating gate, and a method of manufacturing it. More particularly, the invention relates to technology for preventing a reduction in the erasure efficiency when data erasure is repeated by extracting charges (electrons) stored in the floating gate towards the control gate, thereby extending the operation life (cycle life) of a memory cell.

2. Description of the Related Art

In an electrically erasable non-volatile semiconductor memory device composed of memory cells each consisting of a single transistor, particularly a programmable ROM (EEPROM: Electrically Erasable and Programmable ROM, also referred to as "flash memory"), each memory cell consists of a transistor in a double-gate structure having a floating gate and a control gate. In such a memory cell transistor in a double gate structure, write of data is performed by accelerating hot electrons generated on the side of a drain region so as to be injected into the floating gate. Erasure of data is performed by extracting charges from the floating gate to the control gate through F-N tunneling (Fowler-Nordheim tunneling).

Figure 9:
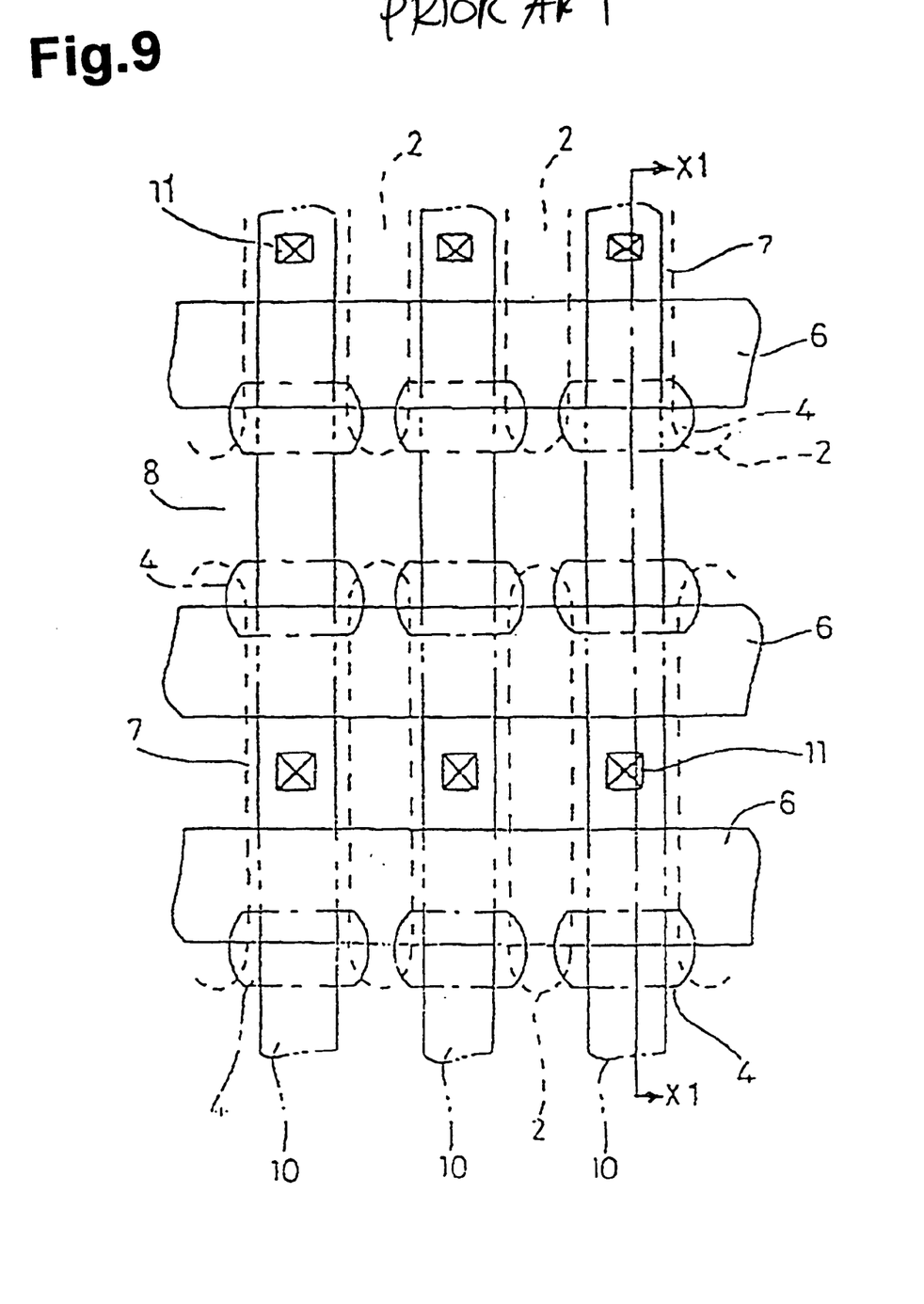
FIG. 9 is a plan view of the structure of a memory cell portion of a conventional non-volatile semiconductor memory device.
Figure 10:
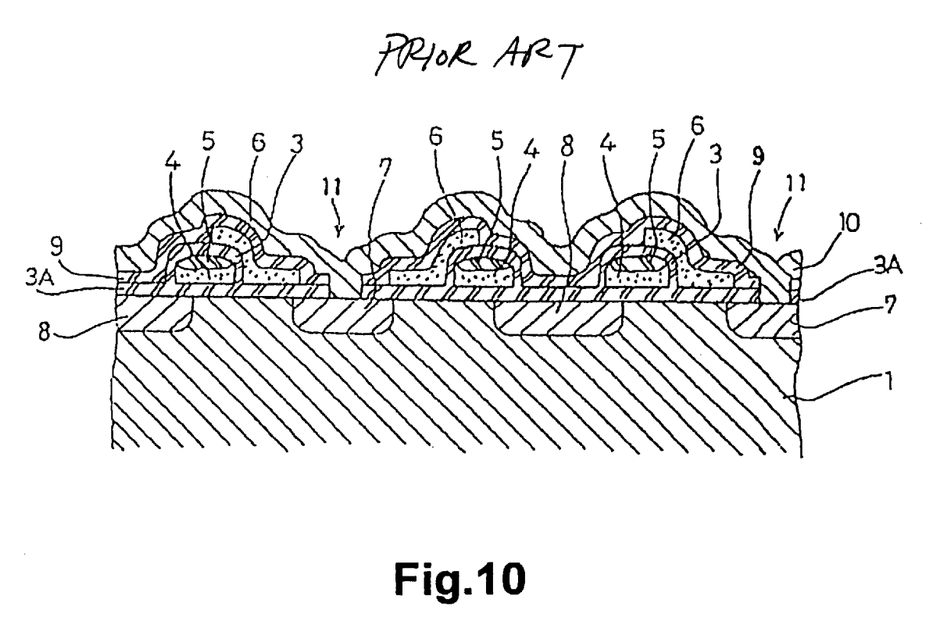
FIG. 10 is a partially sectional view of FIG. 9.

FIG. 9 is a plan view of a memory cell portion of a non-volatile semiconductor memory device having a floating gate. FIG. 10 is a sectional view taken across X1—X1 in FIG. 9. The memory cell portion adopts a split gate structure in which a control gate is arranged in parallel to a floating gate.

A plurality of element isolation films 2 of a thick LOCOS oxide film selectively formed by LOCOS (Local Oxidation Of Silicon are formed in stripes on a surface area of a P-type semiconductor substrate 1 so that element areas are sectioned from one another. Floating gates 4 are formed on the semiconductor substrate 1 so that each of them extends between adjacent element isolation films 2 through an oxide film 3A. The floating gate 4 is arranged individually in each memory cell. By selective oxidation, a selective oxide film 5 on the floating gate 4 is formed to be thicker in the central area and have an acute corner on the edge thereof so that concentration of an electric field is likely to occur at the edge of the floating gate 4 during data erasure.

On the semiconductor substrate 1 on which the plurality of floating gates 4 are arranged, control gates 6 are arranged so as to correspond to the respective columns of the floating gates 4 through the tunneling oxide film 3 integrated to the oxide films 3A. The control gate 6 partially overlaps the floating gate 4 and the remaining portion thereof abuts on the semiconductor substrate 1 through the oxide film 3A. The floating gates 4 and the control gates 6 are arranged so that they are symmetrical from each other in adjacent columns.

An N-type drain region 7 and a N-type source region 8 are formed in the substrate areas between the control gates 6 and between the floating gates 4. The drain region 7 is individually surrounded by the element isolation films 2 between the control gates 6, whereas the source region 8 extends along the control gate 6. These floating gate 4, control gate 6, drain region 7 and source region 8 constitute a memory cell transistor.

A metallic wiring 10 of aluminum alloy is arranged on the control gate 6 in a direction perpendicular to the control gate through an interlayer insulating film 9. The metallic wiring 10 is connected to the drain region 8 through a contact hole 11. Each control gate 6 serves as a word line whereas the source region 8 extending along the control gate 6 serves as a source line. The metallic wiring 10 connected to the drain region 7 serves as a bit line.

In the case of the memory cell transistor in a double gate structure, the "on" resistance between the source and drain varies according to the quantity of charges injected into the floating gate 4. Therefore, by selectively injecting the charges into the floating gate 4 so that the "on" resistance of a specific memory cell transistor is varied, a difference thus produced in the operation characteristic of each memory cell transistor is correlated with the data to be stored.

The respective operations of write, erasure and read of data in the non-volatile semiconductor memory device can be performed in the following manner. In the write of data, the potential of the control gate 6 is set at 2 V; the potential of the drain region 7 is set at 0.5 V and the high potential of the source region 8 is set at 12 V. In this case, the potential of the floating gate 4 is elevated to about 9 V because of the difference in the capacitive couplings between the control gate 6 and floating gate 4 and between the floating gate 4 and substrate (source region 8) (i.e. capacitance between the control gate 6 and floating gate 4 <capacitance between the floating gate 4 and substrate). Thus, the hot electrons generated in the vicinity of the drain region are accelerated toward the floating gate 4 and injected into the floating gate 4 through the oxide film 3A, thereby making the write of data.

In the erasure of data, the potential of each of the drain region 7 and source region 8 is set at 0 V and that of the control gate 6 is set at 14 V. In this case, the charges (electrons) pass through the tunnelling oxide film 3 from the acute portion at the corner of the floating gate 4 by the F-N (Fowler-Nordheim tunneling) conduction so that they are discharged into the control gate 6, thereby making the erasure of data.

In the read of data, the potential of the control gate 6 is set at 4 V; that of the drain region 7 is set at 2 V and that of the source region 8 is set at 0 V. In this case, if the charges (electrons) have been injected in the floating gate 4, the potential at the floating gate 4 becomes low. Therefore, no channel is formed beneath the floating gate 4 so that a drain current does not flow. In contrast, if the charges (electrons) have not been injected in the floating gate 4, the potential of the floating gate 4 becomes high. Therefore, the channel is formed beneath the floating gate 4 so that the drain current flows.

Figure 7:
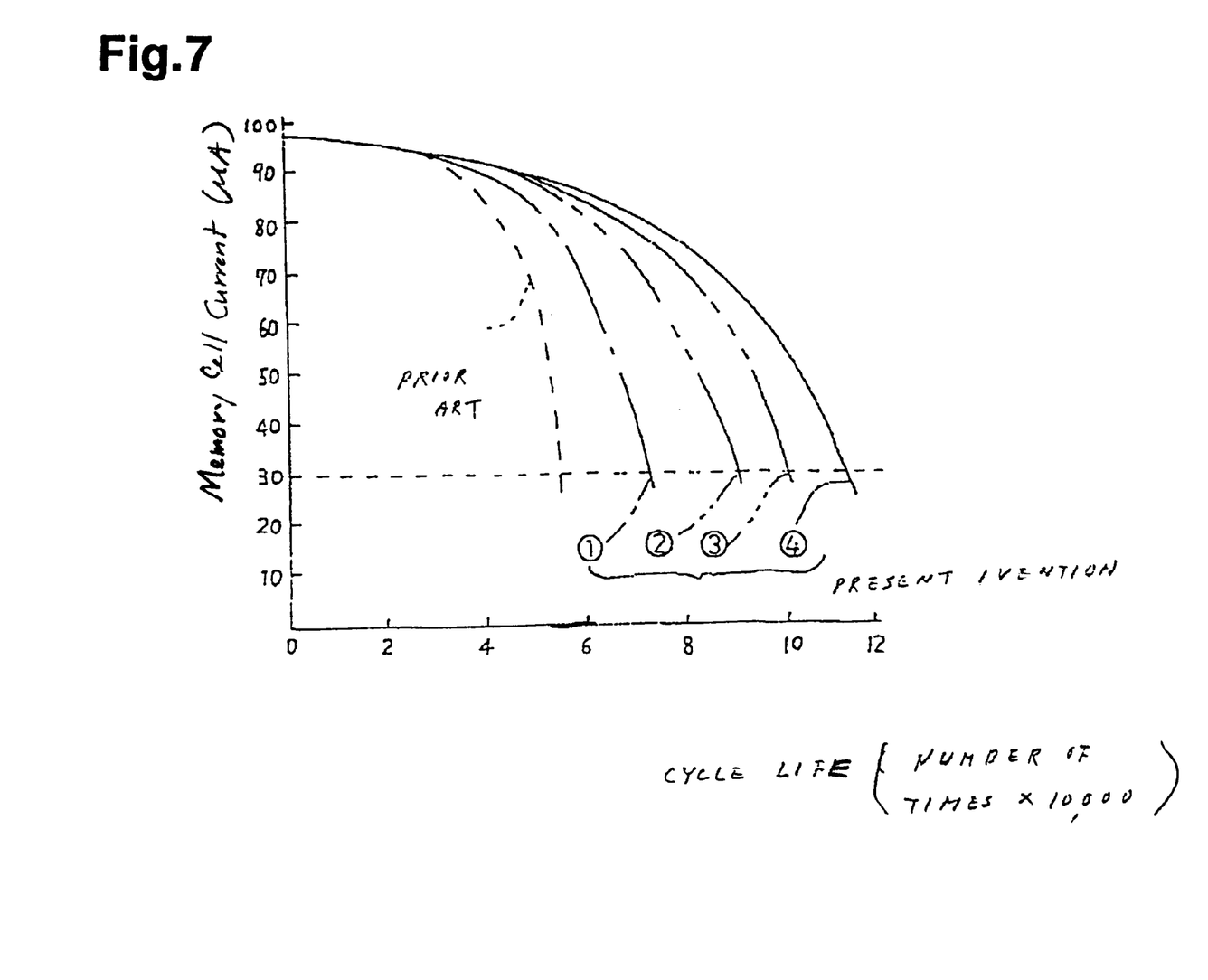
FIGS. 7 and 8 are graphs showing cycle lives of non-volatile semiconductor memory devices.

FIG. 7 is a graph showing a measurement result of a cycle life (number of times of the erasure/write of data: E/W Cycle) in a conventional device having the above configuration. As seen from the graph, the measured current in the memory cell (ordinate) lowers with an increase of the E/W cycle (abscissa). Incidentally, as seen, in the conventional non-volatile semiconductor memory device, the number of times of erasure/write of data when the cell current lowers to a decidable level (e.g. when the memory cell current of the memory cell in the erasure state becomes 30 μm which is 30% of the initial value of 100 μm) is 50,000 times (see dotted line in FIG. 7). A general programmable memory requires the E/W cycle of about 100,000 times, and that of 50,000 times is insufficient. Therefore, it has been demanded to increase the E/W cycle.

As a result of analysis by the inventors of the present invention, it h as been found that the material of the interlayer insulating film for med on the memory cell transistor is correlated with the cycle life.

Specifically, in an device configuration in which a relatively large level difference occurs because the control gate overlaps the floating gate like the non-volatile semiconductor memory device according to the present invention, an interlayer insulating film 9 subjected to an etch back step of an SOG (Spin on Glass) film is formed.

The inventors have supposed that the cycle life is influenced by the fact that moisture or H atoms (mainly moisture in the SOG film) contained in the TEOS film and SOG film will be diffused and trapped by the tunneling oxide film.

SUMMARY OF THE INVENTION

An object of the present invention is to provide a non-volatile semiconductor memory device capable of improving the operation life of a memory cell, and its manufacturing method.

In order to attain the above object, the invention is characterized by provision of a barrier film for preventing the moisture or H atoms in an interlayer insulating film from being diffused and an oxide film covering the barrier film formed by plasma CVD, which are formed between a metallic wiring and the interlayer insulating film.

Figure 5:
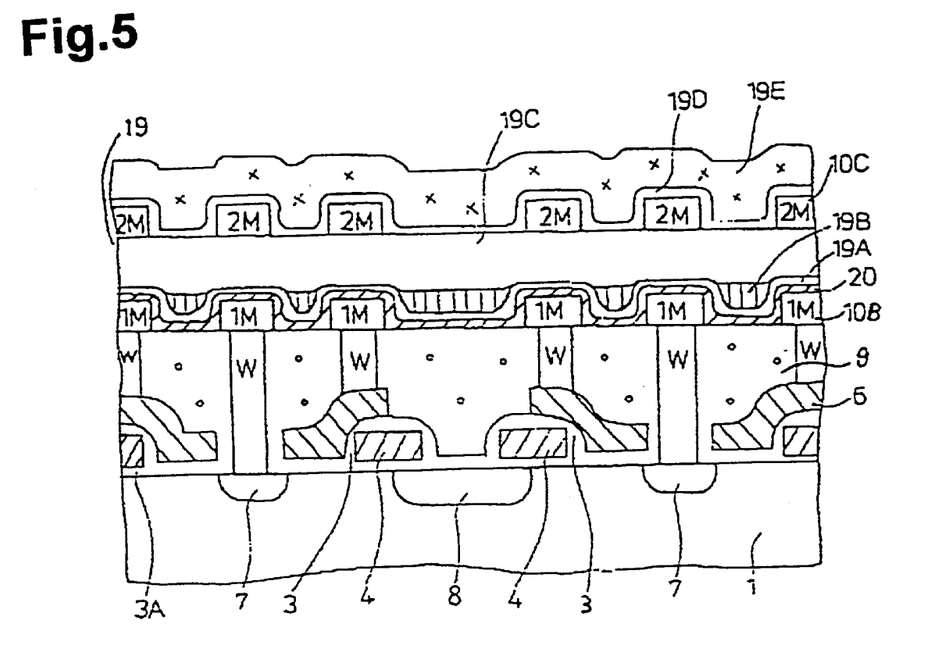

Specifically, the non-volatile semiconductor device according to the invention is characterized, as shown in FIG. 5 in that a barrier film of a SiON film is formed below an interlayer insulating film which is a single layer film or laminated film of an TEOS film and SOG film covering a floating gate 4 and control gate 6. The SiON film which is good in moisture blocking but poor in coverage (particularly at the corner of the object to be covered) is covered with another TEOS film 19A which is better in coverage than the SiON film, thereby improving the barrier property of the barrier film. Such a configuration prevents moisture or H atoms (mainly moisture the SOG film) contained in the TEOS film and SOG film from being diffused and trapped by the tunneling oxide film 3, thereby improving the trap-up rate and hence endurance characteristic. This configuration prevents the moisture and H atoms from being diffused and trapped by the gate oxide film, thereby improving the hot carrier resistant characteristic.

Figure 1A:
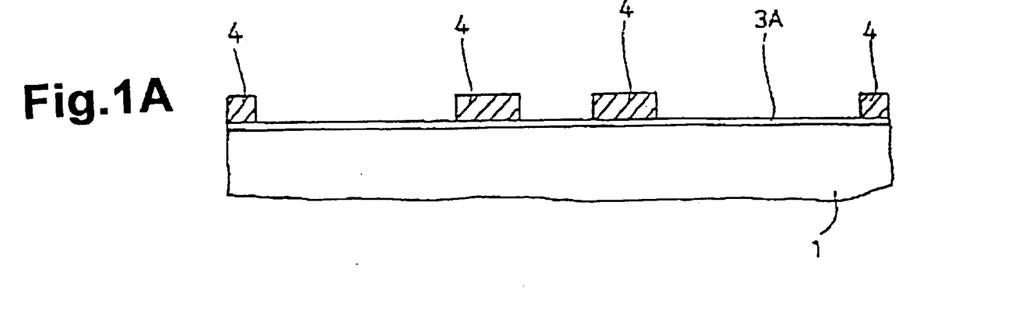
FIGS. 1 to 5 are sectional views for explaining a method of manufacturing a non-volatile semiconductor memory device according to an embodiment of the invention.
Figure 1B:
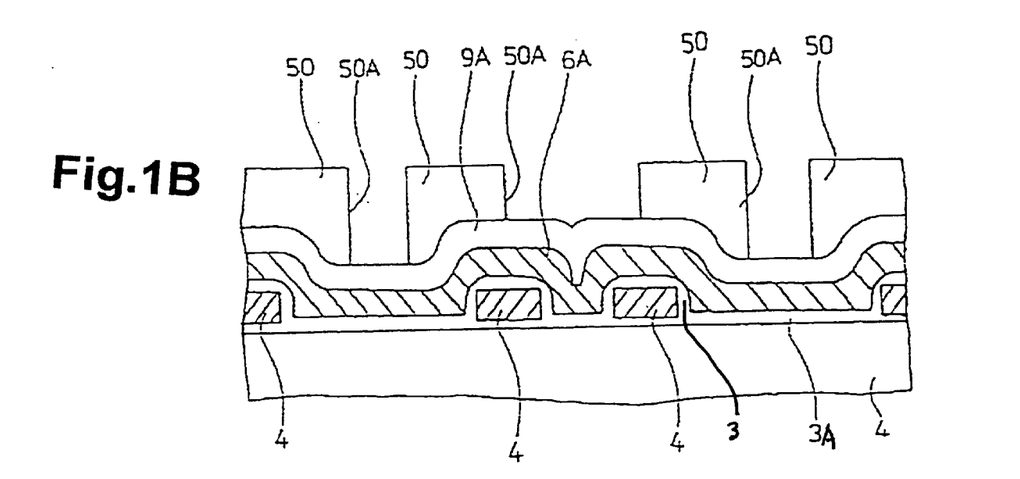
Figure 2A:
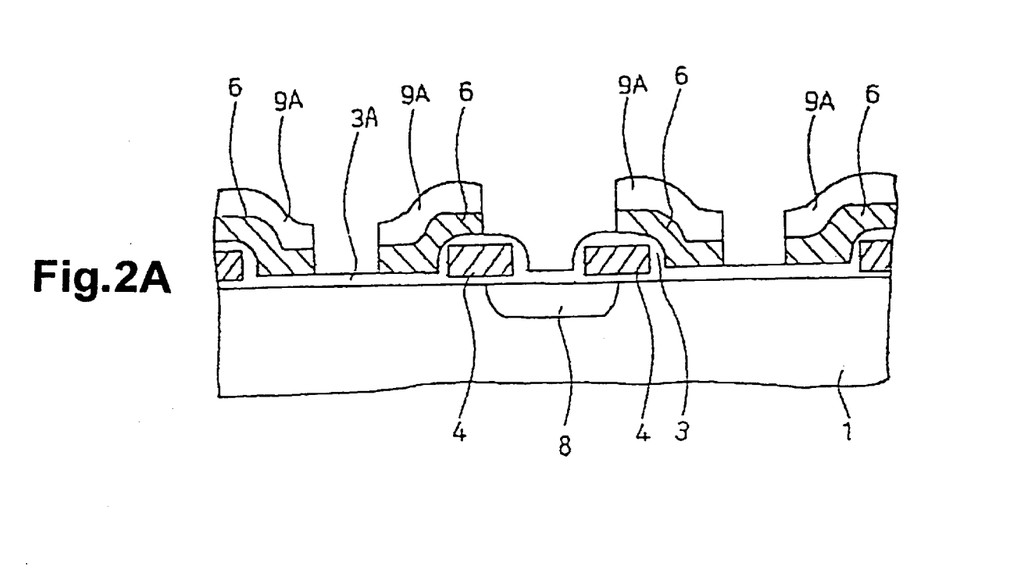
Figure 2B:
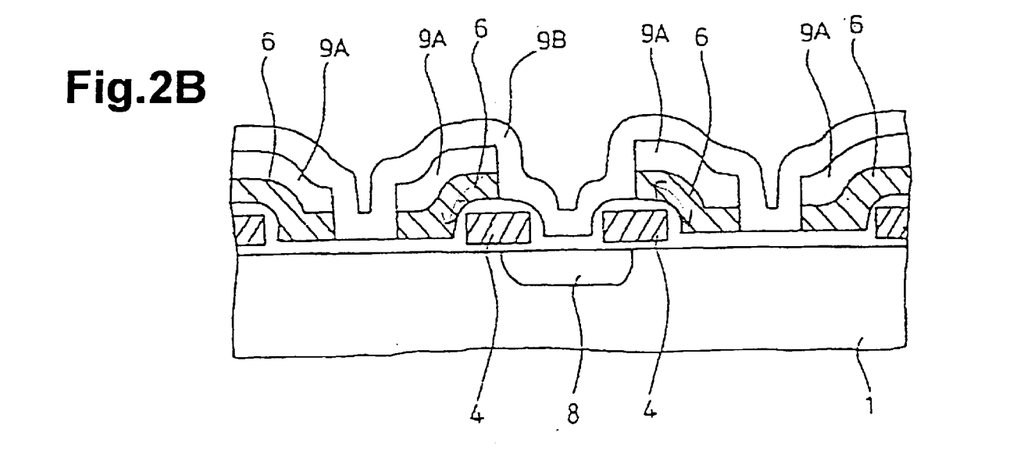
Figure 3A:
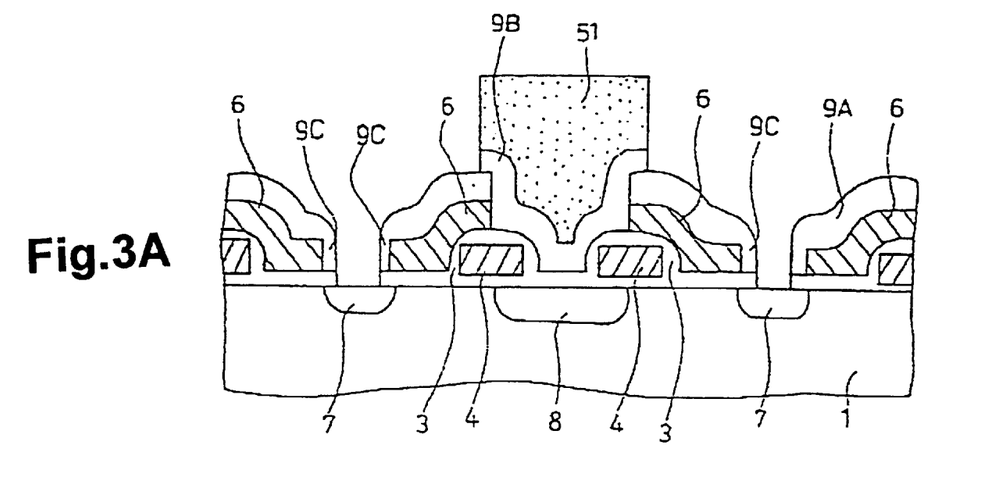
Figure 3B:
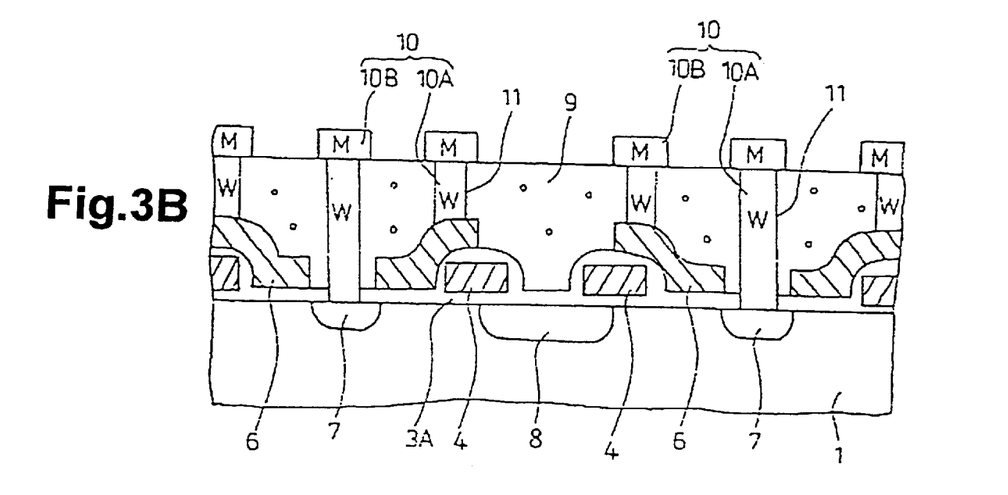

The manufacturing method according to the invention is characterized by comprising the following steps. First, as shown in FIG. 1A, a conductive polysilicon (poly-Si) film is formed on a gate oxide film 3A which has been formed on a P-type Si substrate by thermal oxidation, and thereafter the polysilicon film is patterned to form a floating gate 4. Next, as shown in FIG. 1B, a tunneling oxide film 3 is formed to cover the floating gate 4, and on the tunneling oxide film 3, a conductive film 6A composed of a poly-Si film and tungsten silicide (WSix) film and an insulating film 9A are stacked and the stacked film is patterned to form a control gate 6 having a region overlapping the floating gate 4 through the tunneling film 3 (FIG. 2A). Subsequently, as shown in FIGS. 2B and 3A, source/drain regions 7 and 8 are formed on the surface layer of the substrate so that they are adjacent to the floating gate 4 and control gate 6, and thereafter, as shown in FIG. 3B, metallic wirings 10 are formed which are in contact with the control gate 6 and/or the source/drain regions 7 and 8 through the underlying insulating film 9. Further, a barrier film 20 of e.g. SiON film capable of preventing moisture and H atoms contained in the interlayer insulating film 19 from being diffused is formed below an upper insulating film 19 which is a single layer or laminate layer of e.g. TEOS film, SOG film, etc. formed so as to cover the upper layer of the memory cell portion consisting of the elements described above (FIG. 4A). Finally, as shown in FIG. 4B, a TEOS film 19A is formed to cover the barrier film 20 as shown in FIG. 4B, and the TEOS film is etched back so that it is not removed completely, thereby forming the interlayer insulating film 19 composed of the SOG film 19B and TEOS film 19C.

Figure 6A:
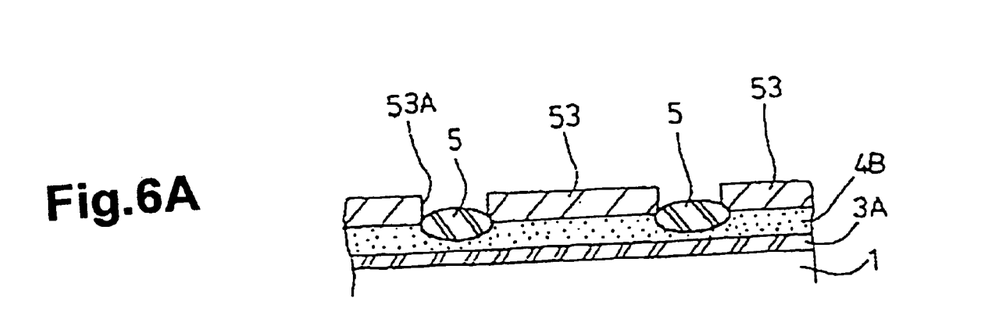
FIGS. 6A to 6C are sectional views for explaining a method of manufacturing a non-volatile semiconductor memory device according to another embodiment of the invention.
Figure 6B:
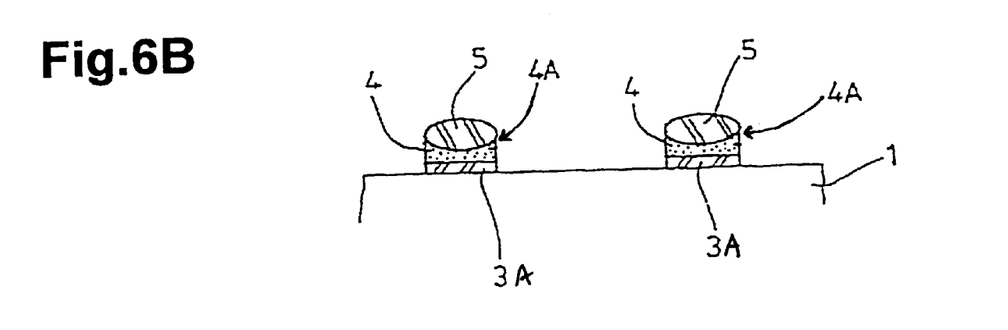
Figure 6C:
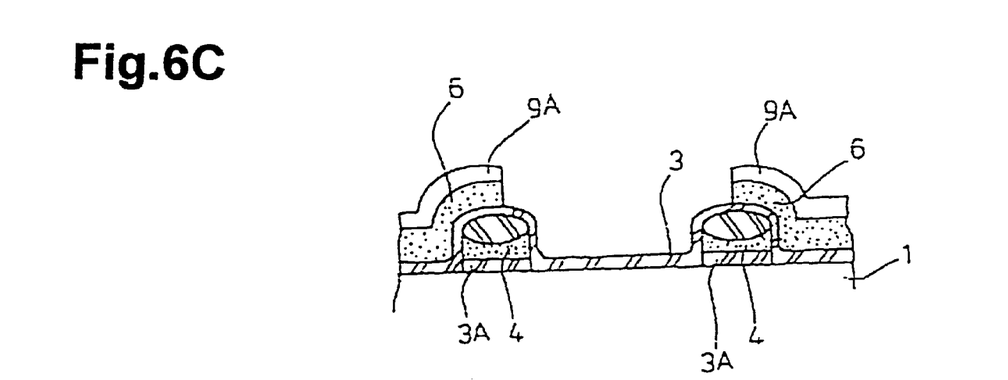

Another manufacturing method according to the invention is characterized by comprising the following steps. First, as shown in FIG. 6A, a gate oxide film 3A is formed by thermal oxidation of the surface of a P-type Si substrate, a polysilicon (poly-Si) film 4B made conductive is formed on the gate oxide film 3A, a silicon nitride film 53A having an opening with a prescribed pattern is formed on the poly-Si film 4B, and thereafter a selective oxide film 5 is formed by selective oxidation of the poly-Si film 4B through the opening 53A (FIG. 6A). Next, as shown in FIG. 6B, the poly-Si film 4B is etched using as a mask the selective oxide film 5 to form a floating gate 4 having an acute corner 4A on its upper portion. Subsequently, as shown in FIG. 6C, a tunneling oxide film 3 is formed to cover the floating gate 4, on the tunneling oxide film 3, a conductive film 6A composed of a poly-Si film and tungsten silicide (WSix) film and an insulating film 9A are stacked and thereafter the stacked film is patterned to form a control gate 6 having a region overlapping the floating gate 4 through the tunneling film 3. Subsequently, as shown in FIGS. 2B and 3A, source/drain regions 7 and 8 are formed on the surface layer of the substrate so that they are adjacent to the floating gate 4 and control gate 6, and thereafter, as shown in FIG. 3B, metallic wirings 10 are formed which are in contact with the control gate 6 and/or the source/drain regions 7 and 8 through the underlying insulating film 9. Further, a barrier film 20 of e.g. SiON film capable of preventing moisture and H atoms contained in the interlayer insulating film 19 from being diffused is formed below an upper insulating film 19 which is a single layer or laminate layer of e.g. TEOS film, SOG film, etc. formed so as to cover the upper layer of the memory cell section consisting of the elements described above (FIG. 4A), Finally, as shown in FIG. 4B, a TEOS film 19A is formed to cover the barrier film 20 as shown in FIG. 4B, and the TEOS film 19A is etched back so that it is not removed completely, thereby forming the interlayer insulating film 19 composed of the SOG film 19B and TEOS film 19C.

In accordance with the present invention, in the process of flattening the interlayer insulating film composed of an oxide film, SOG film, etc. which is formed by the plasma CVD on an SiON film serving as a barrier film formed so as to cover the memory cell portion, the oxide film is etched back by a degree not completely removed so that the barrier property of the SiON film can be improved. This is because the SiON film having inferior coverage is covered with the organic oxide film having better coverage than the SiON film.

Therefore, production of a trapping site which is attributable to the diffusion of moisture or H atoms from the interlayer insulating film into the tunneling oxide film can be suppressed, thereby improving the trap-up-rate and endurance characteristic and increasing the number of times of erasure/write of data to extend the operation life of the memory cell portion.

The trapping of moisture or H atoms diffused from the interlayer insulating film by the gate oxide film can be also suppressed so that the resistance against hot carriers of the transistor can be improved.

The above and other objects and features of the invention will be more apparent from the following description taken in conjunction with the accompanying drawings.

DESCRIPTION OF THE PREFERRED EMBODIMENTS

Now referring to the drawings, an explanation will be given of an embodiment of a non-volatile semiconductor memory device according to the invention and its manufacturing method. Incidentally, the plan view of the memory cell portion of the non-volatile semiconductor memory device having a floating gate and its sectional view taken along line X1—X1 are substantially the same as FIGS. 9 and 10 used to explain the conventional device. In order to avoid repetition of the explanation, in the explanation of the invention, like reference numeral refer to like elements or portion.

The feature of the invention resides in the structure of an interlayer insulating film covering a memory cell portion formed of a floating gate 4 and a control gate 6 as shown in FIG. 5 which is a partially enlarged view of FIG. 10. Specifically, although described in detail later, such a memory cell portion is apt to provide a large level difference. Therefore, in a device structure in which an interlayer insulating film 19 flattened by a plasma TEOS (Tetra-Ethyl-Ortho-Silicate) film and a SOG film (Spin On Glass) is used as an upper layer, in order to restrain the deterioration in characteristic of the memory cell portion due to the diffusion of moisture or H atoms (mainly moisture in the SOG film) from these plasma TEOS film and SOG film, a barrier film 20 is located. The barrier film is formed of e.g. an SiON (called silicon oxynitride film) capable of preventing moisture or H atoms from being diffused into the memory cell portion and is given in the previous step when the interlayer insulating film 19 is formed. The SiON film has an excellent moisture blocking property, but poor coverage (particularly poor at the corner of an object to be covered). On the other hand, the TEOS film has better coverage than that of the SiON film. Therefore, by covering the SiON film with the TEOS film, the SiON film can be given an improved barrier property.

Thus, even when moisture or H atoms contained in the TEOS film, SOG film, etc. constituting the interlayer insulating film is diffused, its trapping by the tunnelling oxide film 3 is suppressed, thereby improving the trap-up-rate and endurance characteristic.

Its diffusion and trapping by the gate oxide film 3A can be also suppressed so that the hot carrier resistant characteristic of the transistor can be improved.

Now referring to the drawings simplified for convenience for illustration, an explanation will be given of a method of manufacturing a memory cell portion of the non-volatile semiconductor memory device described above.

First, in FIG. 1A, an element isolation film 2 is formed in a prescribed region of a semiconductor substrate 1 (FIG. 9) and a gate oxide film 3A having a thickness of about 70 Å–150 Å is formed on the other surface layer than the element isolation film 2. A poly-Si film having a thickness of 100 nm–200 nm is formed on the gate oxide film 3A and doped with phosphorus so as to be made conductive. The poly-Si film is patterned by the known photolithography to form floating gates 4.

As shown in FIG. 1B, an insulating film (hereinafter referred to as a tunneling oxide film 3A) having a thickness of 20 nm–40 nm is formed integrally to the gate oxide film 3A so as to cover the floating gate 4. The tunneling oxide film 3 can be formed by thermally oxidizing the CVD oxide film (e.g. TEOS (Tetra Ethyl Orth Silicate) film or HTO (High Temperature Oxide) film formed on the substrate by the plasma CVD.

A conductive film 6A having a double-layer structure composed of a poly-Si film a tungsten silicide (WSix film) is formed on the entire surface of the substrate 1. The conductive film 6A can be formed in such a manner that the poly-Si film having a thickness of 100 nm–200 nm previously formed is doped with phosphorus from a diffusion source of POCl$_3$ and thereafter the tungsten silicide film (WSix film) having a thickness of 100 nm –200 nm is formed on the poly-Si film. After an insulating film 9A having a thickness of about 200 nm–300 nm is formed on the conductive film 6A, a photoresist film 50 is formed on the insulating film 9A. Openings 50A are formed at positions of the resist film 50 corresponding to the areas where source/drain regions are to be formed.

The insulating film 9A and conductive film 6A are etched using the resist film 50 as a mask so that a control gate 6 with the insulating film 9A stacked thereon is formed so as to extend from the upper portion of the floating gate 4 to the side wall thereof through the tunneling oxide film 3. After the resist film 50 has been removed, at least the areas where the source/drain regions are to be formed are covered with a photoresist film (not shown). Using the photoresist film as a mask, N-type impurities such as phosphorus ions are implanted in a surface layer of the substrate 1 between the adjacent floating gates 4 under the implanting condition of dosage of $4.0–5.0\times10^{15}/cm^2$ and accelerating voltage of 50–100 KeV, and diffused by annealing to form a source region 8. The N-type impurities for ion implantation may be As ions. Subsequently, as shown in FIG. 2B, an insulating film which an oxide film having a thickness of about 200 nm,is formed on the entire surface of the substrate 1. Thereafter, as shown in FIG. 3A, a photoresist film 51 is formed on the floating gate 4 and control gate 6 on the side adjacent to the source region 8. Using the photoresist film 51 as a mask, the insulating film 9B and tunneling oxide film 3 are etched anisotropically to expose the upper surface of the areas where drains are to be formed and to form side wall spacers 9C. N-type impurities such as phosphorus ions are implanted in the surface layer of the substrate 1 between the adjacent control gates 6 under the implanting condition of dosage of $1.0–2.0\times10^{13}/cm^2$ and accelerating voltage of 40–60 KeV, and diffused by annealing to form drain regions 7. The N-type impurities for ion implantation may be As ions.

Next, as shown in FIG. 3B, an interlayer insulating film 9 composed of a TEOS film and BPSG film having a thickness of 600 nm –800 nm is formed on the entire surface of the substrate 1. Thereafter, tungsten plugs 10A of e.g. tungsten film are formed in contact holes 11 formed on the drain regions 7 and control gates 6. Metallic films (e.g. Al film, Al—Si film, Al—Cu film, Al—Si—Cu film) are formed on the tungsten plugs 10A so that first metallic wirings 10B are formed.

Further, an upper interlayer insulating film 19 is formed to cover the metallic wirings 10B. Incidentally, although the interlayer insulating film 9 in FIG. 5 is illustrated to have relatively good flatness for convenience of illustration, it is actually influenced by the level difference of the memory cell portion (FIG. 10). Therefore, the upper interlayer insulating layer 19 must be subjected to flattening processing.

Figure 4A:
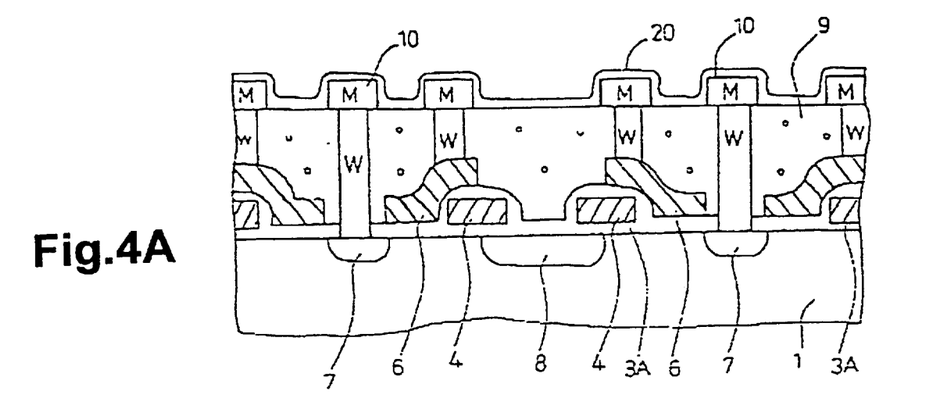
Figure 4B:
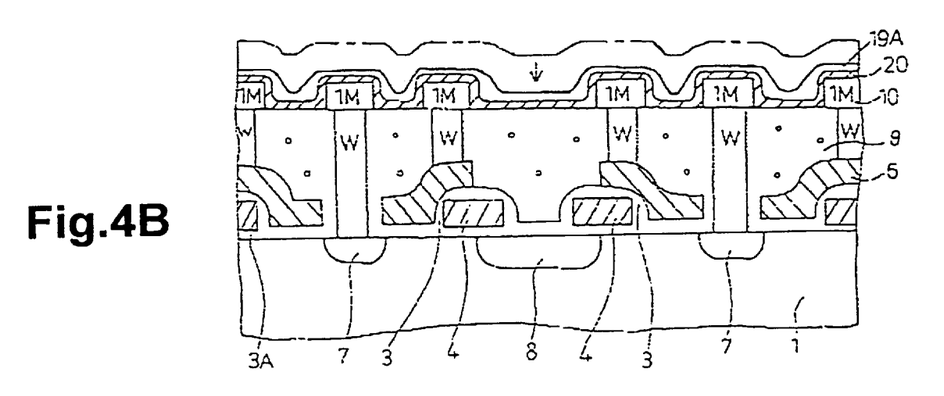

First, as shown in FIG. 4A, a barrier film 20 of e.g a SiON film having a thickness of about 50 nm–200 nm is formed on the entire surface of the substrate so as to the metallic wirings 10B. In this step, silane ($SiH_4$), $N_2O$ and $N_2$ are deposited, respectively under the flow conditions of 250 sccm–550 sccm, 9400 sccm, and 4500 sccm by the plasma CVD. For example, N content in the SiON film formed by the above plasma CVD, is 5.4 atomic % ($SiH_4$:250 sccm), 5.6 atomic % ($SiH_4$:450 sccm), 6.6 atomic % ($SiH_4$:450 sccm), 8.1 atomic % ($SiH_4$:550 sccm).

As shown in FIG. 4B, a plasma TEOS-$SiO_2$ film (indicated by one-dot chain line in FIG. 4B) having a thickness of 850 nm–750 nm is formed on the barrier film 20 by the plasma CVD, and thereafter is etched back by about 700 nm to be left as a plasma TEOS film 19A having a thickness of 50 nm–150 nm.

Subsequently, as shown in FIG. 5, an SOG film 19B and a TEOS film 19C are successively formed on the plasma TEOS film 19A to form the upper interlayer insulating film 19. Incidentally, another SOG film and another TEOS film may be further formed on the TEOS film 19C to form the upper interlayer insulating film. Contact holes are formed which reach the first metallic wirings 10B through the interlayer insulating film 19 and tungsten plugs are embedded in the contact holes. Second wirings 10C are formed on the plugs, respectively. Further, a silicon oxide film 19D is formed so as to cover the second metallic wirings 10C. Thereafter, a silicon nitride film 19E is formed as a final passivation film.

Thus, the non-volatile semiconductor memory device according to the invention is completed.

Now referring to FIG. 6, an explanation will be given of a method of forming an acute corner on the upper portion of each of the floating gates as shown in FIG. 10.

First, as shown in FIG. 6A, the surface of a P-type Si substrate 1 is thermally oxidized to form a gate oxide film 3A, 25 and a poly-Si film 4B doped with phosphorus to be made conductive is formed on the gate oxide film 3A. A silicon nitride film 53 having openings 53A in a prescribed pattern is formed on the poly-Si film 4B, and thereafter the poly-Si film 4B is selectively oxidized through the openings 53A to form selective oxide films 5.

As shown in FIG. 6B, using the selective oxide films 5, the poly-Si film 4B is etched anisotropically to form floating gates 4 each having an acuter corner 4A on the its upper portion.

As shown in FIG. 6C, a tunnelling oxide film is formed so as to cover the floating gates 4. Thereafter, a conductive film composed of a poly-Si film and tungsten silicide (WSix) film and an insulating film 9A are stacked on the tunneling oxide film 3. The stacked film is patterned to form control gates 6 each having a region overlapping the floating gate through the tunneling oxide film 3. Because of the provision of the acute corner 4A, concentration of an electric field is apt to occur at the corner of the floating gate 34 during the erasure of data, thereby improving the erasure characteristic. Thereafter, the various succeeding steps described above will executed to complete the non-volatile semiconductor memory device according to the invention.

Thus, the cycle life of the memory device according to the invention (number of times of the erasure/write of data: E/W Cycle) is about 80,000 times (one-dot chain line) as shown in FIG. 7. It can be seen that the endurance characteristic and cycle life have been improved as compared with the conventional device.

The inventors of the present invention have found experimentally that there is a correlation between the endurance characteristic of the memory cell and the refractive index of the SiON film. Namely, the endurance characteristic is more greatly influenced with an increase in the refractive index. It has been also experimentally confirmed that the refractive index can be increased by increasing the flow rate of silane ($SiH_4$). For example, when the flow rate of silane is changed to 250, 350, 450, and 550 sccm, the SiON film having a refractive index of 1.52, 1.54, 1.56 and 1.59, respectively can be deposited. The measurement result of each SiON film is shown in FIG. 7. As seen, the SiON film having the refractive index of 1.52 led to the cycle life of 80,000 times (one-dot chain line); the SiON film having the refractive index of 1.54 led to the cycle life of 100,000 times (two-dot chain line); the SiON film having the refractive index of 1.56 led to the cycle life of 110,000 times (three-dot chain line); and the SiON film having the refractive index of 1.59 led to the cycle life of 120,000 times (solid line). In this way, the cycle life is increased with an increase in the refractive index of the SiON film. Incidentally, it should be noted that a change in the flow rate of $N_2O$ and $N_2$ does not so greatly contribute to an increase in the refractive index. There is also a report that an increase in the refractive index is effective to the resistance of hot carriers. Oxygen rich SiON film having the refractive index of 1.5–1.65 (N content is 5.0–15.0 atomic %) is preferable. This is thought that although nitrogen element act as a water block and hydrogen atom trap, nitrogen is accompanied with hydrogen element, and therefore when nitrogen element is increased, hydrogen content is increased and endurance is lowered. N(nitrogen) content in SiON is preferably in a range between 5.0 atomic % and 10.0 atomic % and the cycle life is improved.

The gas used to deposit the SiON film is not only a combination of $N_2O$, $N_2$ and $SiN_4$, but also may be a combination of $N_2O$ and $SiN_4$ or of $NH_3$, $N_2O$ and $SiH_4$.

As a result of analysis by the inventor, it has been found that the characteristic of the device has been improved more greatly when the barrier film 20 is covered with the TEOS film than when the barrier film 20 is used as a single layer.

The cycle lives were measured in the cases where the barrier film 20 having a thickness of 100 nm was covered with the plasma TEOS film having a thickness of 100 nm, and where only the barrier film having a thickness of 200 nm was formed. In the latter case, an experimental result of shorter cycle was given. This is probably attributable to the following fact. The SiON, which is inorganic is effective as a moisture-resistant barrier film, but relatively coarse in film quality. On the other hand, the TEOS film which is an organic CVD is more excellent than the SiON film in film quality. Therefore, covering the inorganic SiON film with the organic TEOS film may compensate for the defect of the SiON that the inorganic film is inferior in the coverage and is likely to produce cracks or voids. Where the TEOS film is etched back completely, the SiON film may be damaged and its barrier property may be deteriorated.

Figure 8:
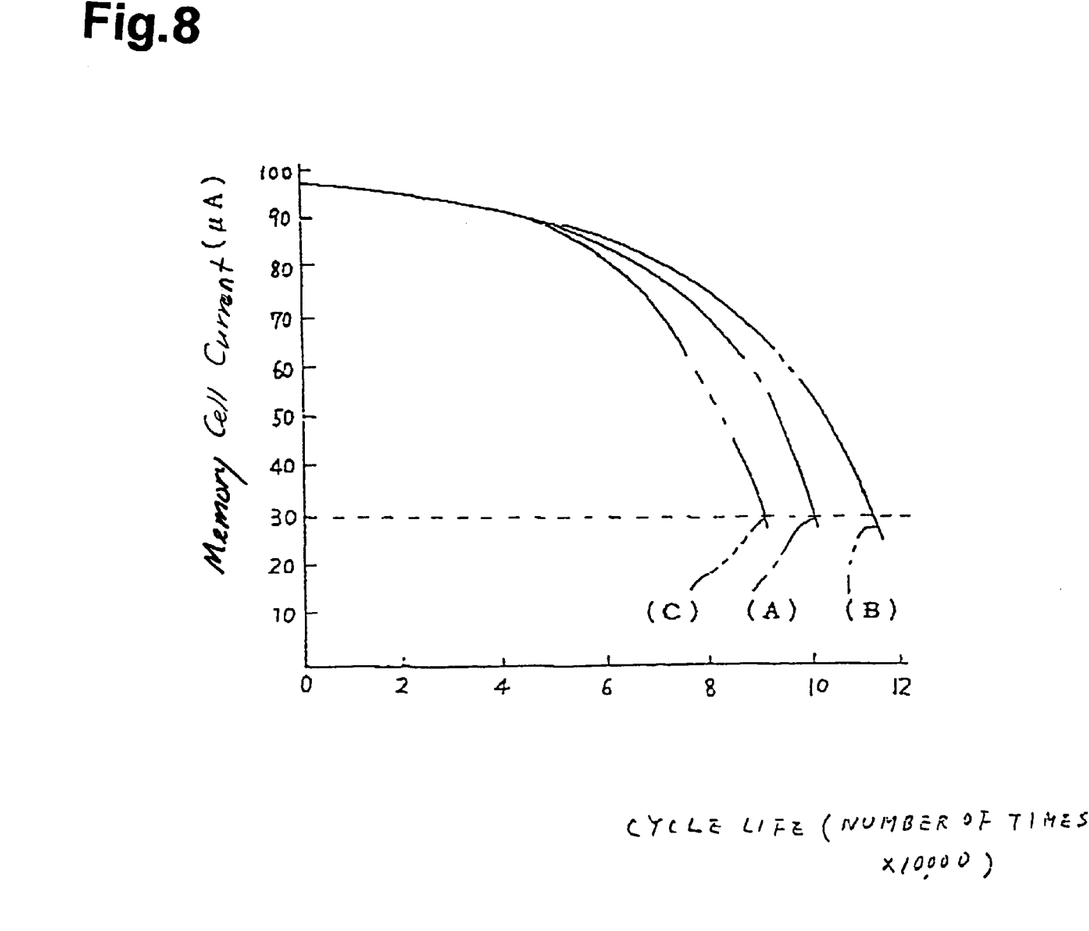

For example, the cycle lives were measured in the cases where a TEOS film having a thickness of 850 nm formed on a SiON film having a thickness of 50 nm was etched back by 700 nm (A); the TEOS film having a thickness of 800 nm formed on a SiON film having a thickness of 100 nm was etched back by 700 nm (B); and the TEOS film having a thickness of 700 nm formed on a SiON film having a thickness of 200 nm was etched back by 700 nm and removed completely (C). The measurement results of each SiON film is shown in FIG. 8. The case A where the TEOS having a thickness of 150 nm was formed on the SiON film having a thickness of 50 nm led to the cycle life of 11,000 times. (one-dot chain line), the case B where the TEOS film having a thickness of 100 nm was formed on the SiOn film having a thickness of 100 nm led to the cycle life of 12,000 times (two-dot chain line) and the case C where only the SiON-film-was formed led to the cycle life of 10,000 times (three-dot chain line) From this experimental result, it could be seen that-the cycle life was more greatly improved in the case where only the SiON film was formed than the case where the composite layer of the SiON film and the TEOS film and that the SiON film must have a certain thickness (e.g. 50–150 nm).

Further, supposedly since not experimented, also where the SiON film having a thickness of 200 nm or more is formed and covered with the TEOS film, the cycle life may be improved. However, an increase in the thickness of the SiON film exaggerates the defects of the inferior coverage of the inorganic SiON film and high likelihood of occurrence of cracks or voids so that the cycle life may be lowered.

The barrier film 20 may be formed below the metallic wirings 10B (i.e. on the underlying interlayer insulating film 9). In short, the SiON film (deposition temperature of about 400 ° C.) constituting the barrier film 20 should be formed at the area not subjected to the high temperature heat treatment in the subsequent steps. The temperature of the heat treatment after the deposition of the SiON film is limited to 450° C.–550° C. Therefore, the barrier film 20 must be formed on or over the BPSG film (deposition temperature of about 70° C.) constituting the underlying interlayer insulating film 9.

Additionally, it can be proposed to use an SiN film as the barrier film 20. Comparison is made between the SiN film and the SiON film. The SiN film has a larger difference in the refractive index from the TEOS film (refractive index of about 1.46) than the SiON film (SiN film>SiON film). This makes it impossible to measure the thickness of the remaining film. In addition, the SiON film (permeability of about 7), which has a larger permeability than the SiON film (permeability of about 4.4 –4.8), produces line capacitance between wirings. Further, the SiN film, which contains a larger quantity of H atoms than the SiON, deteriorates the resistance against hot carriers.

Furthermore, where the SiN film is formed below the BPSG film located beneath the metallic wirings 10B, the following problems may occur. Since there is a difference between the BPSG film and the SiN film in their etching rate, its shape will be deteriorated when the contact holes are made (the SiN film extends out like a peak to the side wall of the contact hole, and this peak may give rise to "volcano" when the tungsten plug is formed). Further, as described above, the SiN film may lead to the problems that the permeability or remaining film cannot be measured.

With respect to the SiON film, single layer and multilayer can be applicable corresponding to the user needs such as rewritten times. In the case that single layer is used, process is simplified and producing costs can be reduced.

In the above embodiments, the present invention was applied to a split-gate type flash memory, but may be applied to a stacked-gate type flash memory.

What is claimed is:

1. A non-volatile semiconductor memory device comprising:
    a memory cell portion including a floating gate and a control gate formed on a Si substrate; and
    a barrier film entirely covering said memory cell portion;
    wherein said barrier film comprises a SiON film with a nitrogen content in a range from 5 to 15 atomic percent.

2. The device according to claim 1, wherein the range of nitrogen content is preferably from 5 to 10 atomic percent.

3. The device according to claim 1, wherein the barrier film further comprises a CVD oxide film formed over the SiON film.

4. A non-volatile semiconductor memory device comprising:
    a memory cell portion including a floating gate and a control gate formed on a Si substrate; and
    a barrier film entirely covering said memory cell portion;
    wherein said barrier film comprises a SiON film having a range of refractive index from 1.5 to 1.65.

5. The device according to claim 4, wherein the range of refractive index is preferably from 1.5 to 1.6.

6. the device according to claim 4, wherein the barrier film further comprises a CVD oxide film formed over the SiON film.

7. A non-volatile semiconductor memory device comprising:
    floating gate formed on a Si substrate of a first conduction type;
    an insulating film covering the floating gate;
    a control gate disposed over said floating gate through the insulating film;
    a diffused region of a second conduction type formed on a surface of said Si substrate adjacent to said floating gate and said control gate;
    a metallic wiring in contact with said control gate and/or diffused region;
    an interlayer insulating film disposed over the floating gate, the control gate, the diffused region and the metallic wiring;
    a barrier film comprising a SiON film and disposed between said metallic wiring and said interlayer insulating film; and
    a CVD oxide film covering said barrier film;
    wherein said barrier film has a range of refractive index from 1.5 to 1.65.

8. The device according to claim 7, wherein said interlayer insulating film comprises:
    a first plasma-CVD oxide film disposed over the barrier film;
    an SOG film disposed over the first plasma-CVD oxide film; and
    a second plasma CVD oxide film disposed over the SOG film.

9. The device according to claim 7, wherein
    said barrier film comprises said SiON film with a nitrogen content in a range from 5 to 15 atomic percent.

* * * * *